(12) United States Patent
Yang et al.

(10) Patent No.: US 7,239,518 B2
(45) Date of Patent: Jul. 3, 2007

(54) UNIVERSAL LOCKING DEVICE FOR HEAT SINK

(75) Inventors: Bo-Yong Yang, Shenzhen (CN); Shin-Hsuu Wung, Tu-Cheng (TW); Chun-Chi Chen, Tu-Cheng (TW)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 35 days.

(21) Appl. No.: 11/265,369

(22) Filed: Nov. 1, 2005

(65) Prior Publication Data

US 2007/0097649 A1   May 3, 2007

(51) Int. Cl.
*H05K 7/20* (2006.01)

(52) U.S. Cl. ............... 361/704; 257/718; 174/16.1; 165/80.3

(58) Field of Classification Search ............ 361/704, 361/697, 719; 257/718, 719; 174/16.1; 165/80.3
See application file for complete search history.

(56) References Cited

U.S. PATENT DOCUMENTS

| 6,215,659 | B1 | 4/2001 | Chen |
| 6,343,011 | B1 | 1/2002 | Yu |
| 6,477,050 | B1* | 11/2002 | Herring et al. .............. 361/704 |
| 6,552,905 | B2* | 4/2003 | Herring et al. .............. 361/704 |
| 7,142,422 | B2* | 11/2006 | Lee et al. .................... 361/695 |
| 7,167,367 | B2* | 1/2007 | Zhang ........................ 361/704 |
| 2003/0159819 | A1* | 8/2003 | Lee ............................ 165/185 |
| 2004/0004812 | A1 | 1/2004 | Curlee, et al. |
| 2006/0120053 | A1* | 6/2006 | Lee et al. .................... 361/704 |

FOREIGN PATENT DOCUMENTS

| CN | 2632851 Y | 8/2004 |
| TW | 586652 | 1/2004 |

* cited by examiner

*Primary Examiner*—Michael C. Zarroli
(74) *Attorney, Agent, or Firm*—Morris Manning & Martin LLP; Tim Tingkang Xia, Esq.

(57) ABSTRACT

A locking device includes a flat plate for contacting with a heat-generating electronic component, a plurality of fins mounted on the flat plate, four locking feet and four fasteners. The flat plate includes two locking portions at opposite sides thereof. Each locking foot includes two spaced pivot plates at an end thereof, wherein the locking portions of the flat plate are sandwiched between the pivot plates. The locking feet are pivotably connected to the locking portions. The fasteners are secured to ends of the locking feet respectively, opposite to the ends where the spaced pivot plates are formed. The locking feet are pivotably movable between first and second positions. The locking device can be mounted to a first-typed PCB at the first position and a second-typed PCB at the second position.

20 Claims, 5 Drawing Sheets

UNIVERSAL LOCKING DEVICE FOR HEAT SINK

BACKGROUND

1. Field

The present invention relates generally to a locking device, and more particularly to a locking device which can selectively secure a heat sink to heat-generating electronic components mounted on different PCBs with different specifications.

2. Prior Art

It is widely acknowledged that heat is produced during operation of electronic devices such as central processing units (CPUs). The heat produced must be quickly removed to ensure the CPUs working normally. Typically, a heat sink is provided to remove the heat from the CPU. In order to keep the heat sink intimately contacting with the CPU, a locking device is generally required.

For instance, FIG. 5 illustrates a conventional locking device used for securing a heat sink to a CPU 1 mounted on a printed circuit board (PCB) 2. The locking device comprises a planar locking plate 3 and a plurality of screws 4. The heat sink comprises a radial fin section 7 and a heat-conducting pillar 5 having an upright column 6. A plurality of retaining members 9 each with a retaining hole, i.e. threaded hole defined therein, is provided at the PCB 2 surrounding the CPU 1. The locking plate 3 at corners thereof defines a plurality of through holes 8 in alignment with the threaded holes of the retaining members 9. In assembly, the fin section 7 is attached to the column 6 after the column 6 extends through and projects upwardly beyond the locking plate 3. The screws 4 extend through the through holes 8 of the locking plate 3 and further engage with the PCB 2 in the threaded holes of the retaining members 9 respectively, to cause the locking plate 3 to press the pillar 5 downwardly against the CPU 1. Thus, the heat sink is secured to the CPU 1 for heat dissipation. However, the above-mentioned locking device is only applicable for securing the heat sink to the PCB 2 with the retaining members 9 completely in alignment with the through holes 8 of the locking plate 3. Instead, when a PCB having retaining members with a layout different from the above-mentioned due to a different PCB with a different specification being used, it is impossible for the above-mentioned locking device to do such a securing job.

SUMMARY

Accordingly, what is needed is a locking device which is adjustable to match with PCBs having retaining members with different layouts so that the locking device can be used with different PCBs having different specifications.

A locking device in accordance with a preferred embodiment of the present invention comprises a flat plate for engaging with a heat-generating electronic component, a plurality of fins mounted on the flat plate, four locking feet, four pivots and four fasteners. The flat plate comprises two locking portions at opposite sides thereof. Each locking portion defines two through holes therein. Each locking foot comprises two spaced pivot plates at an end thereof. Each of the locking portions is sandwiched between the pivot plates. The pivot plates are pivotally connected with the locking portions by fitting the pivots in the pivot plates and the locking portions. The fasteners are secured to ends of the locking feet remote from the pivots. The fasteners can be positioned at a first position wherein the locking feet extend in a direction outwardly from the fins, and a second position wherein the locking feet extend in a direction toward the fins so that the locking device can be mounted to different PCBs having different specifications.

Other advantages and novel features of the present invention will become more apparent from the following detailed description when taken in conjunction with the accompanying drawings, in which:

DETAILED DESCRIPTION OF THE EMBODIMENT

Figure 1:
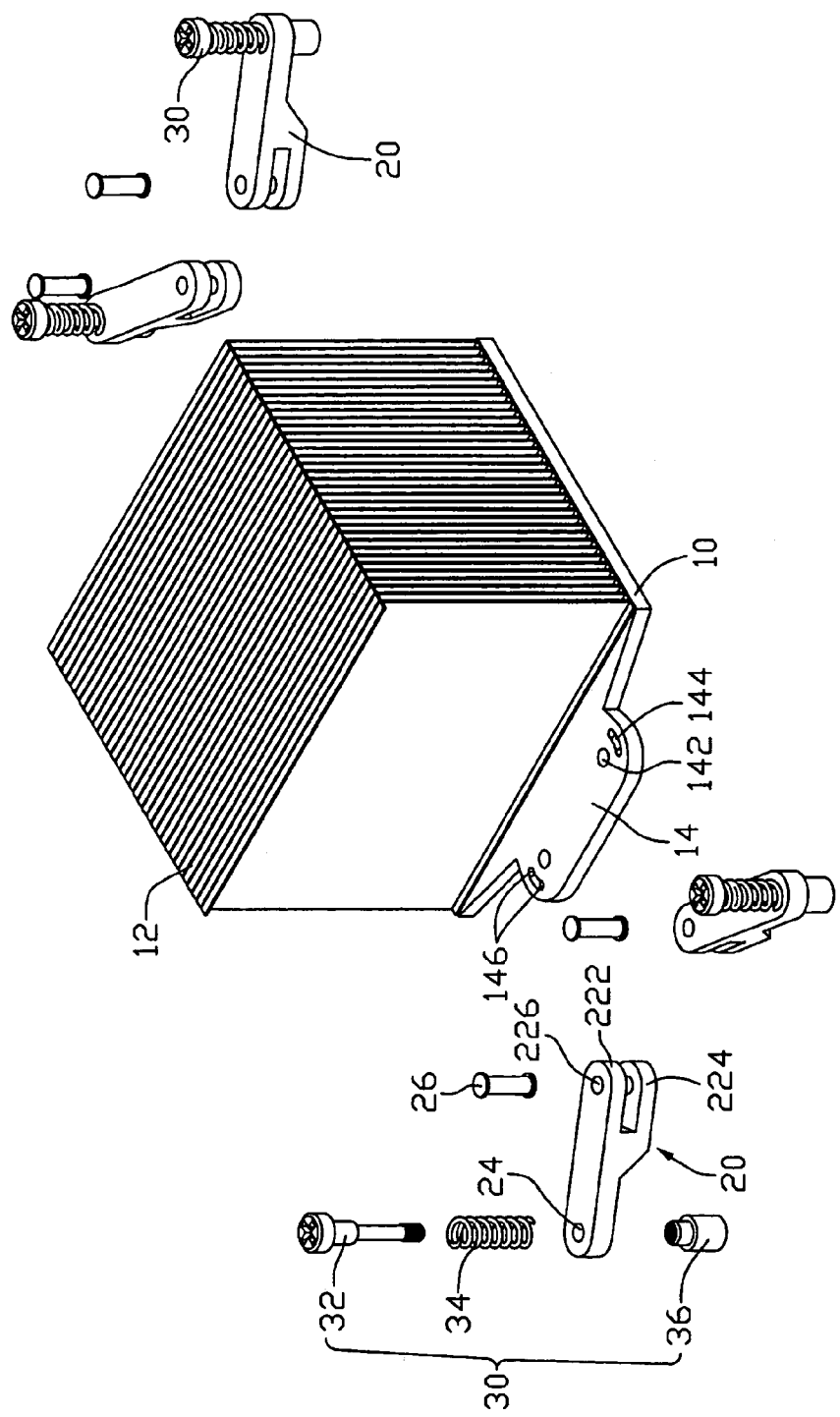
FIG. 1 is an exploded, isometric view of a locking device according to a preferred embodiment of the present invention and a heat sink.

Reference will now be made to the drawing figures to describe the present invention in detail.

Referring to FIG. 1, a locking device according to a preferred embodiment of the present invention comprises a flat plate 10, four locking feet 20 and four fasteners 30 mounted to the locking feet 20 respectively for engaging with mating members (not shown) in a PCB (not shown). The locking feet 20 are pivotably connected to the flat plate 10 by four pivots 26, respectively.

The flat plate 10 comprises a main body (not labeled) for contacting a heat resource (not shown), such as a CPU, to absorb heat from the heat resource. A plurality of fins 12 is soldered to a top face of the main body of the flat plate 10 for dissipating the heat absorbed by the main body of the flat plate 10 from the heat resource to surrounding atmosphere. The main body of the flat plate 10 and the fins 12 constitute a heat sink. Two locking portions 14 respectively extend outwardly from opposite edges of the main body of the flat plate 10. Each locking portion 14 has two round corners. Two through holes 142 are defined in each locking portion 14 adjacent the round corners respectively. An arc-shaped groove 144 is defined in each locking portion 14 between each through hole 142 and a corresponding round corner. The groove 144 defines an arc-shaped concave track. Each groove 144 and a corresponding round corner have a common centre of curvature, i.e., the through hole 142 adjacent to the corner and the groove 144. A pair of recesses 146 is further defined in two opposite extremities of each groove 144, wherein one recess 146 is located closer to the fins 12 on the flat plate 10 than the other.

Figure 2:
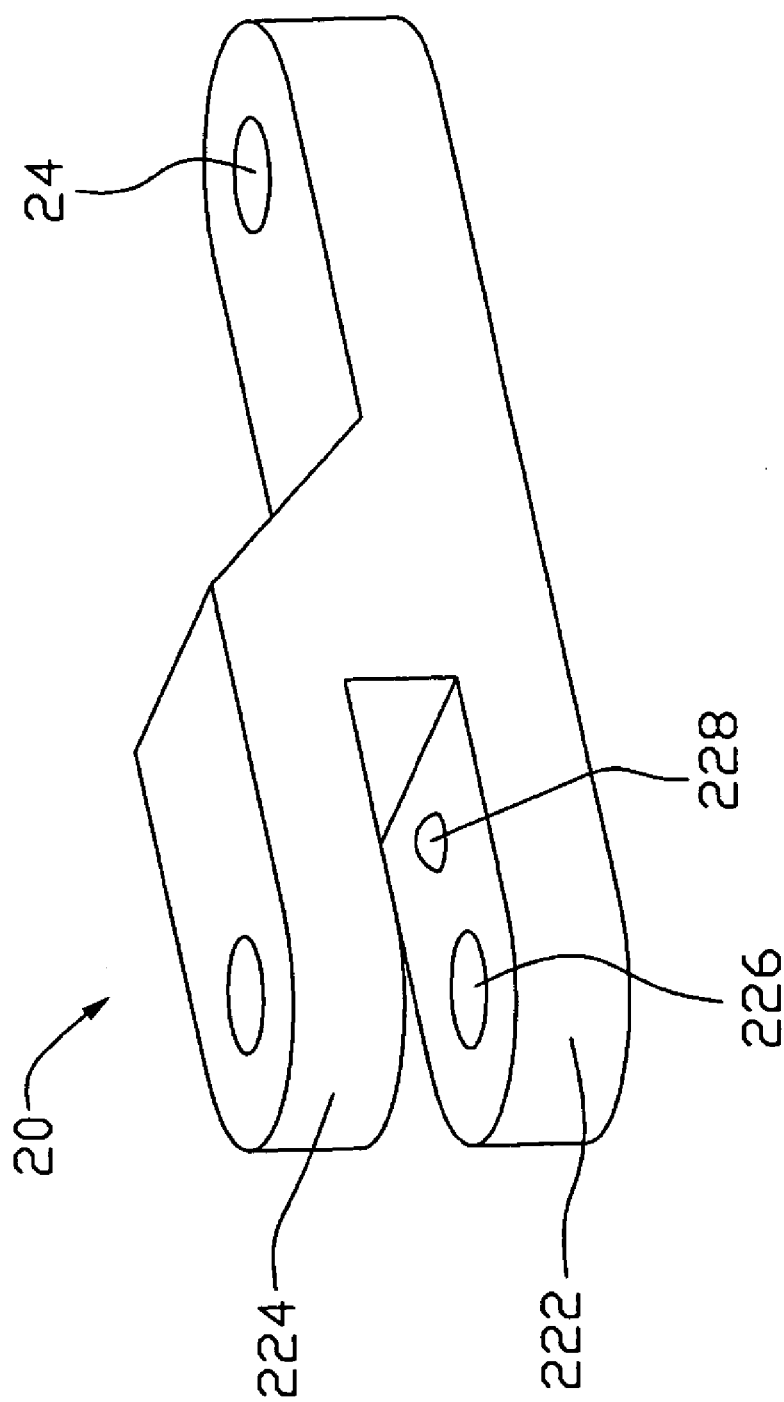
FIG. 2 is an isometric view of a locking foot of the locking device of FIG. 1, the locking foot being positioned upside down.

Referring also to FIG. 2, each locking foot 20 has an elongated configuration. One end of each locking foot 20 is bifurcated to form spaced and parallel pivot plates 222, 224. A pivot hole 226 extends through the pivot plates 222, 224, for aligning with a corresponding through hole 142 of the flat plate 10. A lobe 228 is formed at a bottom face of the pivot plate 222, for slidably engaging in a corresponding groove 144. The other end of each locking foot 20 defines a positioning hole 24 therein for receiving a corresponding fastener 30.

Each fastener 30 comprises a bolt 32 having a head (not labeled) and a threaded bottom end remote from the head, a helical spring 34 and a bushing 36 with inner thread. When assembled, the bolts 32 extend through the springs 34 and the positioning holes 24 of the locking feet 20, and then threadedly engage with the bushings 36. The springs 34 are depressed by the heads of the bolts 32 toward the locking feet 20, whereby the springs 34 exert a downward pressing force on the flat plate 10.

Figure 3:
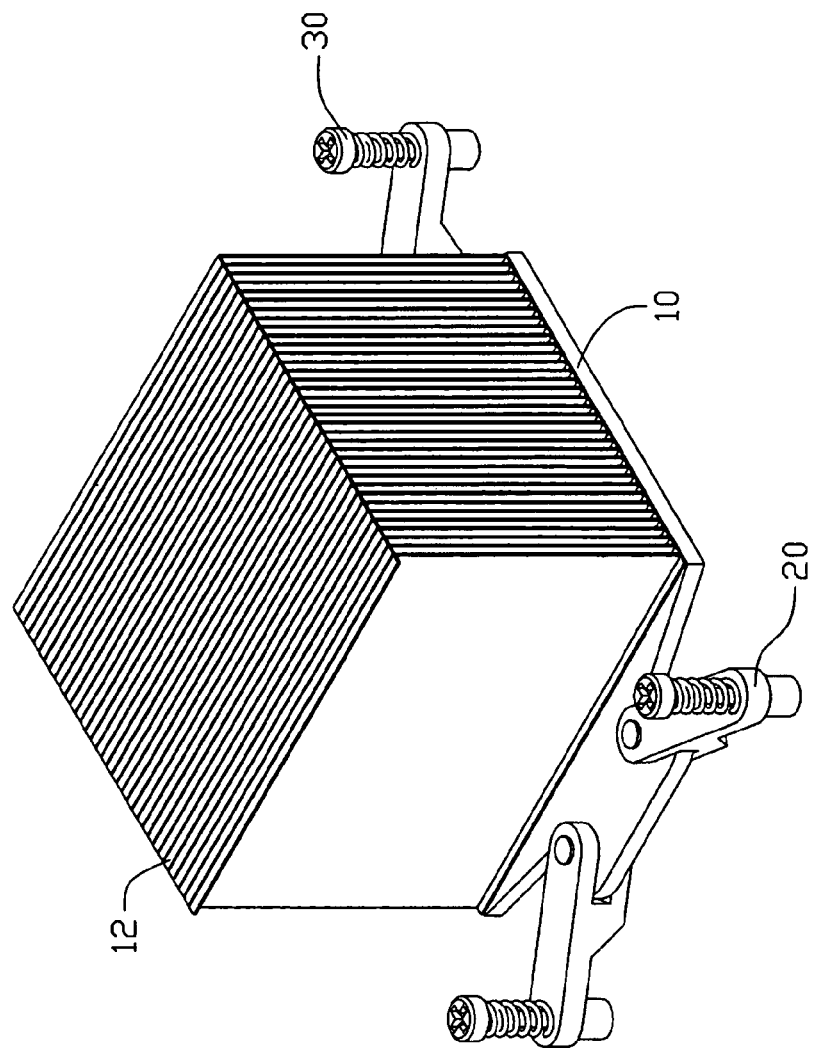
FIG. 3 is an assembled view of FIG. 1 with the locking device being at a first mounting position.
Figure 4:
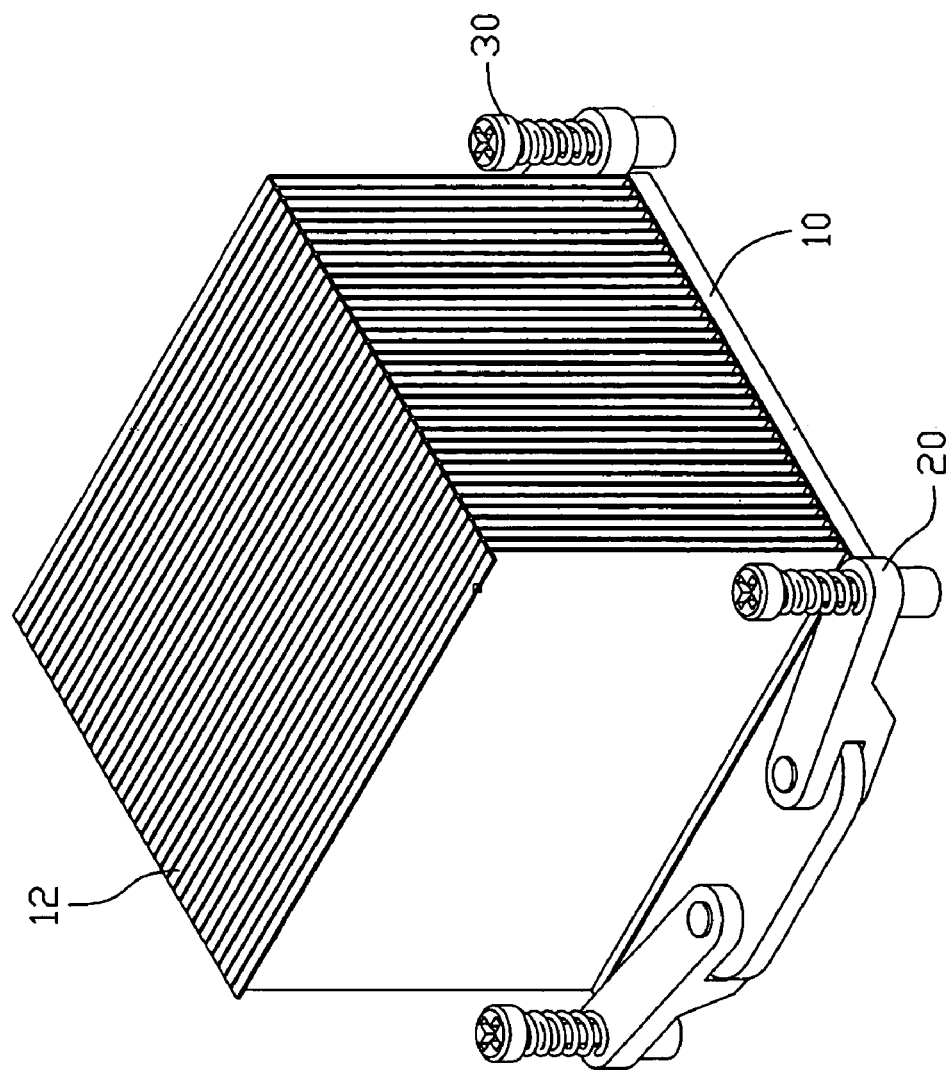
FIG. 4 is an assembled view of FIG. 1, with the locking device being at a second mounting position.
Figure 5:
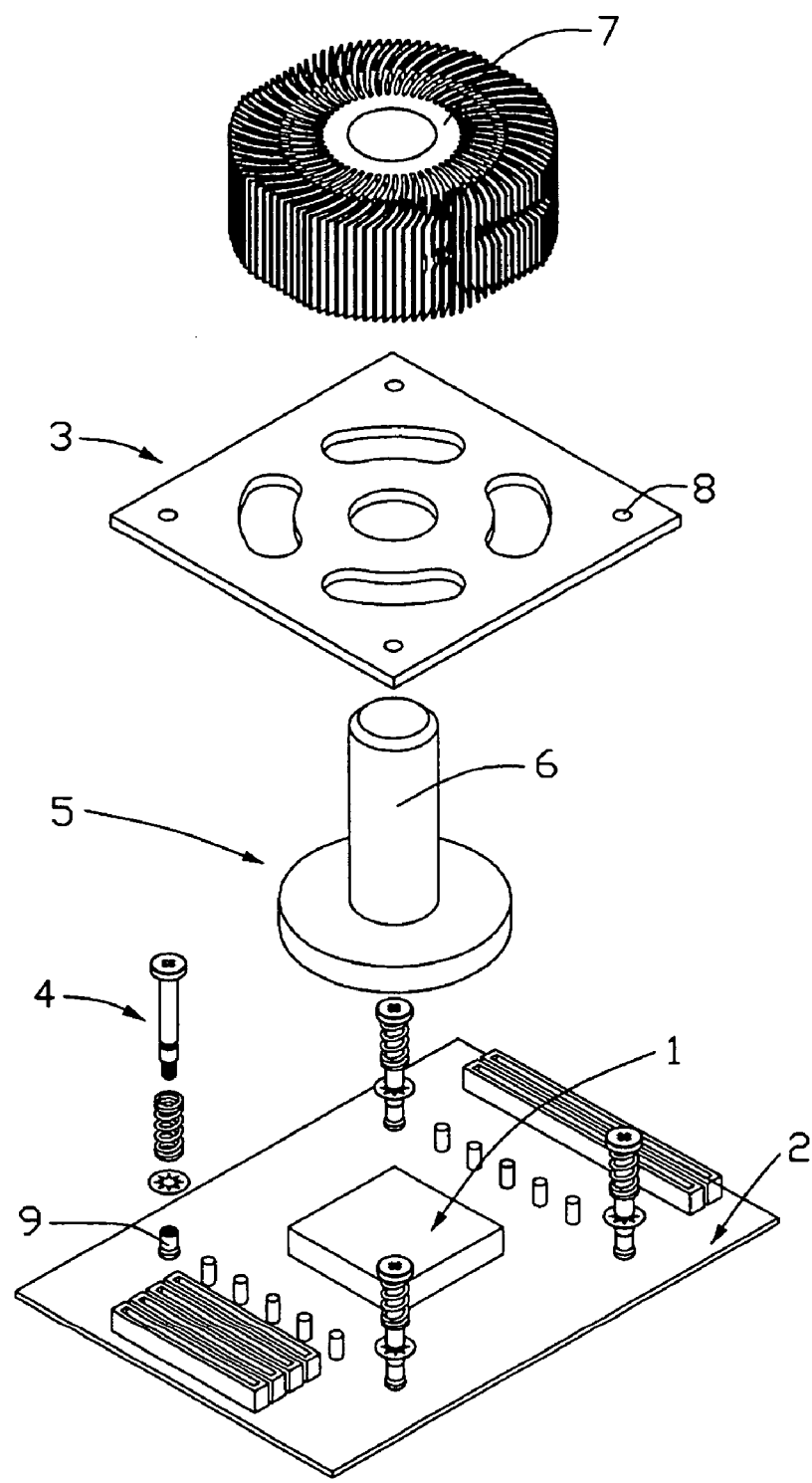
FIG. 5 is an exploded, isometric view of a conventional locking device for securing a heat sink.

Referring to FIGS. 1-3, in assembly, the pivot plates 222, 224 are moved to have the locking portions 14 disposed therebetween and have the through holes 142 defined in the flat plate 10 aligned with the pivot holes 226 of the locking feet 20, respectively. The pivots 26 are then fitted in the through holes 142 and the pivot holes 226 to pivotally connect the locking feet 20 to the flat plate 10. The lobes 228 of the locking feet 20 are received in the grooves 144 of flat plate 10 respectively and can slide in the grooves 144 between the recesses 146 when the locking feet 20 are pivotally moved about the pivots 26 respectively. When the lobes 228 slide into the recesses 146, the locking feet 20 are so positioned that the fasteners 30 can engage with corresponding mating members in the PCB to thereby lock the flat plate 10 on the PCB so that the main body of the flat plate 10 can have an intimate contact with the CPU. As shown in FIG. 3, the lobes 228 are received and located in the recesses 146 which are far way from the fins 12. At this situation, the locking feet 20 are extended outwardly away from the fins 12 to define a mounting position suitable for a kind of PCB, such as a BTX (Balanced Technology Extended) PCB. Thus, the locking device with the heat sink thereon can be mounted to the BTX PCB. As shown in FIG. 4, the lobes 228 are received in the recess 146 which are close to the fins 12. At this situation, the locking feet 20 are extended toward the fins 12 to define another mounting position suitable for another kind of PCB, such as an ATX PCB with the mating members thereof in a different layout from that of the BTX PCB. Thus, the locking device with the heat sink thereon can be mounted to the ATX PCB.

In the preferred embodiment of the present invention, the locking feet 20 are capable of rotating about the pivots 26 to change the mounting position of the locking device. Thus, the locking device is able to match with more than one kind of PCB. It is practicable that additional recesses can be defined in each groove 144 in addition to the recesses 146 defined in the two opposite extremities of the groove 144. Thus, the locking device can be used with not only the ATX and BTX PCBs but also other PCBs having different form factors from the ATX and BTX PCBs.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

We claim:

1. A locking device comprising:
    a flat plate adapted for contacting with a heat-generating electronic component, comprising two locking portions at opposite sides, each of the locking portions defining a through hole therein;
    at least two locking feet each comprising two spaced pivot plates at an end thereof and defining a pivot hole through the pivot plates, the pivot plates having the flat plate disposed therebetween;
    at least two pivots extending in the through holes and the pivot holes whereby the locking feet are pivotally connected to the locking portions of the flat plate; and
    at least two fasteners each secured to an opposite end of a corresponding locking foot, the fasteners being adapted for securing the locking device to an electronic substrate.

2. The locking device of claim 1, wherein each of the locking portions has a round corner and the through hole is defined adjacent the round corner.

3. The locking device of claim 2, wherein a groove is defined in each of the locking portions between the through hole and the round corner.

4. The locking device of claim 3, wherein the groove defines an arc-shaped concave track having a common centre of curvature with the round corner.

5. The locking device of claim 4, wherein a lobe is formed on one of the pivot plates of each of the at least two locking feet and is slidably engaged in the groove.

6. The locking device of claim 5, wherein two recesses are defined in the groove.

7. The locking device of claim 6, wherein when the lobe is located in one of the recesses, the locking device can be mounted to a first-typed electronic substrate, and when the lobe is located in the other of the recesses, the locking device can be mounted in a second-typed electronic substrate.

8. The locking device of claim 7, wherein the recesses are defined at two opposite extremities of the groove.

9. The locking device of claim 1, wherein each of the at least two fasteners comprises a bolt having a threaded bottom end, a helical spring located between a head of the bolt and a corresponding locking foot.

10. The locking device of claim 7, wherein when the lobe is located in the one of the recesses, the locking feet extends outwardly away from the flat plate, and when the lobe is located in the other one of the recesses, the locking feet extends toward the flat plate.

11. A heat dissipating assembly comprising:
    a flat plate supporting a plurality of fins thereon and adapted for contacting a heat resource, the flat plate defining at least two through holes and at least two grooves adjacent to the at least two through holes respectively;
    at least two locking feet pivotally connected to opposite ends of the flat plate by extending at least two pivots through the at least two locking feet and the at least two through holes, each of the at least two locking feet forming a lobe slidably engaging in one of the at least two grooves; and
    at least two fasteners each secured to an end of one of the at least two locking feet for fastening with a printed circuit board.

12. The heat dissipating assembly of claim 11, wherein each of the at least two grooves defines at least two recesses therein, and wherein the lobe is capable of being received in each of the at least two recesses to locate the locking feet relative to the flat plate at different positions.

13. The heat dissipating assembly of claim 11, wherein each of the at least two fasteners comprises a bolt having a head and a threaded bottom end remote from the head, and a helical spring surrounding the bolt and located between the head and a corresponding locking foot.

14. The heat dissipating assembly of claim 11, wherein the springs are compressed by the heads of the bolts toward the at least two locking feet and accordingly exert a pressing force on the flat plate.

15. A heat dissipation device for removing heat from a heat-generating electronic component, comprising:

- a heat sink comprising a base plate adapted for thermally contacting with the heat-generating electronic component and a plurality of fins extending upwardly from the base plate;
- a locking plate secured to the heat sink and defining an arc-shaped guiding track thereon with two opposite first and second extremities;
- a foot pivotably mounted to the locking plate, having a locator formed thereon and movably engaging with the guiding track, the foot defining a first mounting position when the locator engages with the first extremity of the guiding track and a second mounting position when the locator engages with the second extremity; and
- a fastener secured to the foot, adapted for fastening with a first-type printed circuit board when the foot is at the first mounting position, and a second-type printed circuit board when the foot is at the second mounting position.

16. The heat dissipation device of claim 15, wherein the locking plate is integrally formed at a side of the base plate as a single piece therewith.

17. The heat dissipation device of claim 15, wherein at the first position, the foot extends outwardly from the fins, and at the second position, the foot extends toward the fins.

18. The heat dissipation device of claim 16, wherein the locator is a lobe and the guiding track is a guiding groove, the lobe engages in the guiding groove, and the foot defines recesses in the first and second extremities of the guiding groove, respectively, the lobe is located in one of the recesses when the foot is positioned in one of the first and second positions.

19. The heat dissipation device of claim 18, wherein the foot has a bifurcated end with an upper pivot plate and a lower pivot plate, the lobe is formed on a bottom surface of upper pivot plate, the locking plate is sandwiched between the upper and lower pivot plates, a pivot is used to pivotally connect the upper and lower pivot plates and the locking plate together.

20. The heat dissipation device of claim 15, wherein the fastener has a bolt having a head and a threaded lower end, and a spring being depressed by the head of the bolt towards the foot.

* * * * *